United States Patent
Xu et al.

(10) Patent No.: US 9,269,588 B2
(45) Date of Patent: Feb. 23, 2016

(54) METHOD OF MAKING FLEXIBLE, FOLDABLE, AND STRETCHABLE DEVICES

(71) Applicant: Wayne State University, Detroit, MI (US)

(72) Inventors: Yong Xu, Troy, MI (US); Hongen Tu, Warren, MI (US); Eric G R Kim, Royal Oak, MI (US); Jessin K. John, Troy, MI (US)

(73) Assignee: WAYNE STATE UNIVERSITY, Detroit, MI (US)

( * ) Notice: Subject to any disclaimer, the term of this patent is extended or adjusted under 35 U.S.C. 154(b) by 0 days.

(21) Appl. No.: 14/418,203

(22) PCT Filed: Jul. 31, 2013

(86) PCT No.: PCT/US2013/053019
§ 371 (c)(1),
(2) Date: Jan. 29, 2015

(87) PCT Pub. No.: WO2014/022558
PCT Pub. Date: Feb. 6, 2014

(65) Prior Publication Data
US 2015/0287607 A1  Oct. 8, 2015

Related U.S. Application Data

(60) Provisional application No. 61/677,795, filed on Jul. 31, 2012.

(51) Int. Cl.
*H01L 21/00*  (2006.01)
*H01L 21/76*  (2006.01)
(Continued)

(52) U.S. Cl.
CPC .......... *H01L 21/3065* (2013.01); *B81C 1/0019* (2013.01); *G01L 19/0092* (2013.01); *H01L 21/3081* (2013.01); *H01L 21/56* (2013.01); *H01L 27/1218* (2013.01); *H01L 27/1262* (2013.01); *H01L 29/0657* (2013.01); *H05K 1/0278* (2013.01); *H05K 1/0283* (2013.01);
(Continued)

(58) Field of Classification Search
CPC ... H05K 1/0278; H05K 1/0283; H05K 1/028; H05K 3/007
USPC ...................... 438/50–53; 257/254, 347, 353, 257/415–420, 618
See application file for complete search history.

(56) References Cited

U.S. PATENT DOCUMENTS 6,375,857 B1   4/2002   Ng et al.
2001/0044165 A1*  11/2001  Lee .................... G02B 26/0841
                                                                 438/52

(Continued)

OTHER PUBLICATIONS

International Search Report & Written Opinion for PCT/US2013/053019 dated Dec. 16, 2013.

*Primary Examiner* — Karen Kusumakar
(74) *Attorney, Agent, or Firm* — Brinks Gilson & Lione

(57) ABSTRACT

A method of making a flexible, foldable, stretchable electronic device. The method includes deposition of a polymer layer, such as parylene C, to impart flexibility to the device. The device overcomes the limitations of related flexible electronics schemes by employing established silicon-on-insulator complementary metal-oxide-semiconductor technology with a flexible enclosure. Devices made in such a way may be used in a wide variety of applications including incorporation into medical devices.

20 Claims, 8 Drawing Sheets

(51) Int. Cl.
H01L 21/3065 (2006.01)
H05K 1/02 (2006.01)
H01L 29/06 (2006.01)
H01L 21/308 (2006.01)
H01L 27/12 (2006.01)
B81C 1/00 (2006.01)
G01L 19/00 (2006.01)
H01L 21/56 (2006.01)
H05K 3/00 (2006.01)
H01L 29/78 (2006.01)
G01L 9/00 (2006.01)

(52) U.S. Cl.
CPC ..... *G01L 2009/0069* (2013.01); *H01L 29/7842* (2013.01); *H05K 3/007* (2013.01)

(56) References Cited

U.S. PATENT DOCUMENTS

| | | |
|---|---|---|
| 2003/0231819 A1 | 12/2003 | Palmer et al. |
| 2007/0048970 A1 | 3/2007 | Suzuki et al. |
| 2011/0177609 A1 | 7/2011 | Ismagilov et al. |
| 2011/0220890 A1 | 9/2011 | Nuzzo et al. |

* cited by examiner

METHOD OF MAKING FLEXIBLE, FOLDABLE, AND STRETCHABLE DEVICES

RELATED APPLICATIONS

This application is a 371 national stage application of PCT Application No. PCT/US2013/053019, filed Jul. 31, 2013, which application claims the benefit of the filing date under 35 U.S.C. §119(e) of Provisional U.S. Patent Application No. 61/677,795 filed Jul. 31, 2012, the entire contents of which are incorporated herein by reference.

FEDERALLY SPONSORED RESEARCH OR DEVELOPMENT

This invention was made with government support under grant number ECCS0747620 awarded by The National Science Foundation. The government has certain rights in the invention.

BACKGROUND

The present invention relates to the fabrication of electronic devices. More particularly, the invention relates to a method of incorporating semiconductors into flexible, foldable, and stretchable devices.

Semiconductors have been used for a number of decades in the construction of a large number of useful devices. Countless technological advances in a great number of fields can be traced to the inclusion of semiconductor technology.

A semiconductor device is typically built upon a silicon wafer. In many cases this architecture is suitable for the application in which the device is to serve, despite the fact that silicon wafers are rigid and brittle. However, other types of devices that rely on semiconductor technology, such as medical devices, would benefit from a more flexible format in order to reduce the chances of cracking or breaking.

Existing fabrication techniques such as direct coating and patterning organic or inorganic semiconductor materials on flexible substrates have been developed, as described in, for instance, U.S. Pat. No. 8,394,706, U.S. Pat. No. 7,557,367, US Publication No. 2011/0220890 A1, US Publication No. 2010/0002402 A1, and US Publication No. 2009/0294803 A1, all of which are incorporated herein by reference in their entireties. However, the nature of the materials used in such flexible devices can preclude the use of processes that require high temperature processes. This further limits the range of materials that can be incorporated and may reduce the effective performance of the device. Moreover, recently developed transfer printing technology has limited utility due to its incompatibility with established complementary metal-oxide-semiconductor (CMOS) technology.

Other fabrication techniques are detailed in publication WO 2013/009833 A1, which is incorporated herein by reference in its entirety. However, because the devices made as described in this application are not patterned into the device layer into discrete islands, they are not stretchable, and the methods described therein preclude the manufacture of tubes and channels.

A number of different approaches of making flexible sensors or electronics have been developed over the last two decades. A straightforward method is to fabricate directly on a flexible substrate, such as the widely used flexible printed circuitry technology and the thin film transistor (TFT) technology on flexible substrates. One example of such an application is the development of flexible large area position sensitive detectors made by depositing amorphous silicon on a polyimide substrate. Flexible multichannel sieve electrodes for interfacing regenerating peripheral nerves on polyimide film have been made using a silicon wafer as a support, resulting in improved dimension control. Simple microelectricalmechanical system (MEMS) structures on plastic substrates, such as amorphous silicon air-gap resonators, have also been demonstrated.

Direct fabrication on flexible substrates offer simple fabrication processes combined with low cost. Large area flexible sensors or electronics can be fabricated in this way. However, high temperature processes cannot be employed and optimization of material properties is difficult since the process temperature is limited due to the nature of the flexible substrate. Limiting the temperature limit makes it almost impossible to monolithically integrate CMOS circuits and many MEMS transducers to the flexible substrate.

Transfer printing methods to make flexible electronics have been demonstrate recently. In these processes, transistors and other devices are fabricated first on silicon-on-insulator (SOI) wafers and then transferred to flexible substrates by a process analogous to printing. Still, the transfer printing step is generally incompatible with commercial CMOS processes. As a result, current transfer printing methods cannot take advantage of mainstream CMOS technology. Consequently, circuit density and performance are limited.

It has been a challenge to design a method for manufacturing flexible, foldable, and stretchable devices that are compatible with established SOI-CMOS processes.

SUMMARY

The present invention generally provides a method of making flexible, foldable, and stretchable devices compatible with silicon-on-insulator complementary metal oxide semiconductor technology.

In one embodiment, the present invention provides a method of making a flexible device based on a silicon-on-insulator wafer. The wafer comprises a device layer having at least one silicon island and at least one metal trace. The device layer is posited on a buried oxide layer. The buried oxide layer being posited on a silicon substrate layer. In a first step, a first polymer layer is deposited over the silicon-on-insulator wafer. The first polymer layer is above and in contact with the at least one silicon island and the at least one metal trace. In a second step, an aperture-formation means is used to form a plurality of etching windows through the first polymer layer, the device layer, and the buried oxide layer. In a third step, an etchant is used to degrade the silicon substrate layer through the plurality of etching windows. In a fourth step, a second polymer layer is deposited conformally over the silicon substrate layer and the silicon-on-insulator wafer. In a fifth step, the silicon substrate layer is removed.

In another embodiment, the invention provides a flexible device made according to the process described above.

In another embodiment, the invention provides a method for making a flexible device. In a first step, a silicon-on-insulator wafer comprising a silicon substrate layer is provided. In a second step, a metal layer is deposited. In a third step, the metal layer is patterned. In a fourth step, a first polymer layer is formed by chemical vapor deposition. In a fifth step, a channel mold is formed by a first etching step of the silicon substrate layer using an etchant. In a sixth step, a channel is formed from the channel mold by depositing a second polymer layer. In a seventh step, at least one silicon island is formed by a second etching step of the silicon substrate layer using an etching process.

DETAILED DESCRIPTION OF THE DRAWINGS AND THE PRESENTLY PREFERRED EMBODIMENTS

The present invention generally provides a method of making flexible electronic devices which are compatible with, though do not necessarily include, established SOI-CMOS processes. The invention also pertains to devices made by such a process.

The terms "substantially" or "about" used herein with reference to a quantity includes variations in the recited quantity that are equivalent to the quantity recited, such as an amount that is equivalent to the quantity recited for an intended purpose or function.

FIG. 1a-1h illustrate steps in a process which can be used to fabricate flexible electronics which are compatible with current SOI-CMOS processes. The compatibility with SOI-CMOS processes will allow for a greater diversity of materials to be used and flexible devices to be made without the limitations of other flexible semiconductor protocols, such as a printing technique. Additionally, FIG. 1i provides a top view of one of the steps in the process.

Figure 1A:
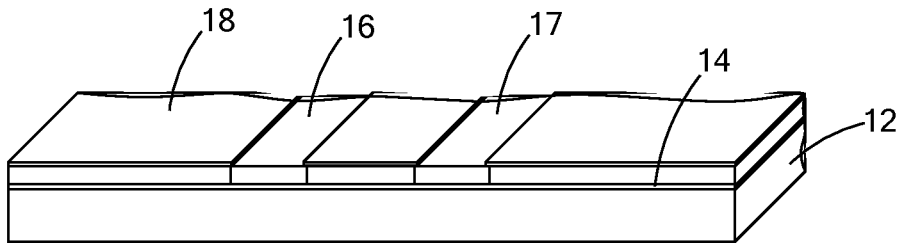
FIG. 1a-1i are views of the steps of a method of fabrication of a flexible device based on SOI-CMOS technology in accordance with one embodiment of the invention.

FIG. 1a illustrates the first step in the process flow for making a flexible electronic device. This initial step comprises providing a SOI wafer as a starting material 10. The electronic components of a device made by a method according to the principles of this invention can be fabricated on SOI wafers using mainstream CMOS or MEMS technologies. In the example illustrated, the SOI wafer comprises an about 2 micron thick n-type device layer, although this only represents a single embodiment out of many possibilities.

In FIG. 1a, silicon substrate layer 12 forms the base of the starting material and a buried oxide layer 14 about 0.5 microns thick is posited across the entirety of an upper surface of silicon substrate layer 12. In one embodiment, in a first step the silicon device layer is selectively doped at source terminal 16 and drain terminal 17 by a boron diffusion process conducted at about 1100° C. for about 15 minutes. Such doping lays the foundation for the generation of a MOSFET. Thermal oxide layer 18 serves as a diffusion mask in this embodiment. The resulting boron oxide layer from the diffusion is subsequently etched away by hydrofluoric acid and the oxide diffusion mask is removed at the same time.

Figure 1B:
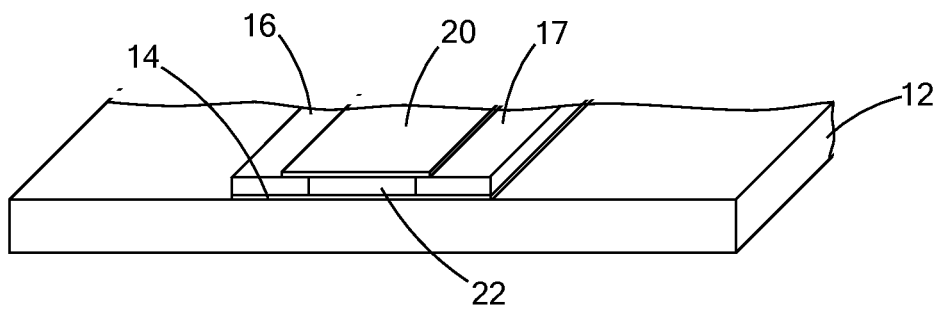

In FIG. 1b, a second step illustrating the deposition of a gate oxide layer 20 about 0.5 micron thick is illustrated. In one embodiment, plasma-enhanced chemical vapor deposition is used to deposit the gate oxide layer 20. The combined processes of the first and second steps can result in exposed, undoped silicon regions (not shown) and if such regions are present, they are removed, resulting in the patterning of a silicon island 22 that lies between the remaining portion of buried oxide layer 14 and gate oxide layer 20.

Figure 1C:
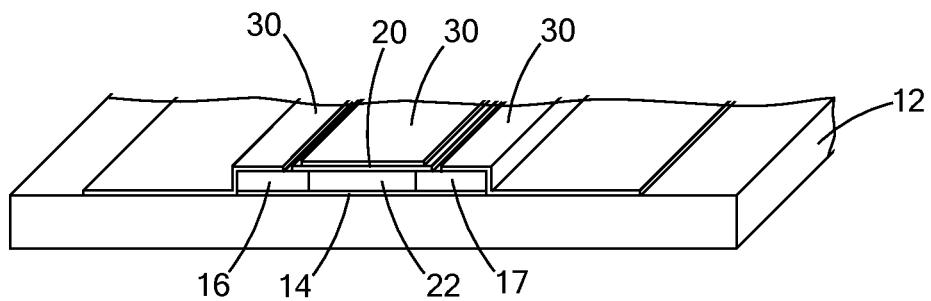

In FIG. 1c, a third step of adding metal traces 30 on the outermost layer of the device is shown. In one embodiment, aluminum traces and contact pads are sputtered and patterned onto the substrate 12 and the silicon island 22. In such an embodiment, a sintering step at about 450° C. can be carried out to form the ohmic contact between the metal layer 30 and the source terminal 16 and drain terminal 17. In this embodiment, at this step the aluminum traces and pads are in direct contact with the handle silicon substrate 12, which would lead to short circuits. However, these short circuits are temporary since the handle silicon layer 12 will be undercut and removed in a subsequent step.

FIG. 1a-1c represent one of many different protocols that can be employed to create the components and circuitry that can be incorporated into a flexible device. In general, prefabrication of metal interconnects and discrete silicon islands which are made on SOI wafers using mainstream CMOS or MEMS technologies by nearly any established method can result in a starting material for a device that can be finished in the flexible format by the procedural steps detailed as follows.

Figure 1D:
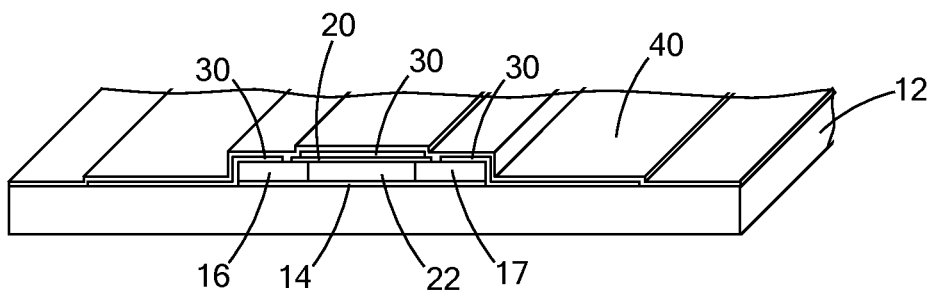

In FIG. 1d, a fourth step comprising the formation of a flexible substrate is shown. A first polymer layer 40 is deposited over the outermost layer of the entire assembly, both the exposed areas of silicon substrate layer 12 and silicon island 22. In one embodiment, the polymer layer comprises parylene C film.

Parylene C is a chemical vapor deposited poly(p-xylylene) polymer which is well known to have excellent properties as a moisture and dielectric barrier. Parylene C is a hydrophobic, biostable, biocompatible coating which is resistant to corrosion. Advantageously, coating by parylene C can occur at ambient temperature in a vacuum, increasing ease of use and reducing stress on the device to be coated.

As shown in FIG. 1d, the first polymer layer 40 is used as an etching mask and as a mechanical layer to support released devices. In one embodiment, the first polymer layer 40 is a layer of parylene C with a thickness of about 3 microns, but this thickness can vary. In addition, other polymers can be used in this step, including but not limited to polyimides, polyurethanes, and organosilicon compounds such as polydimethylsiloxane (PDMS).

Figure 1E:
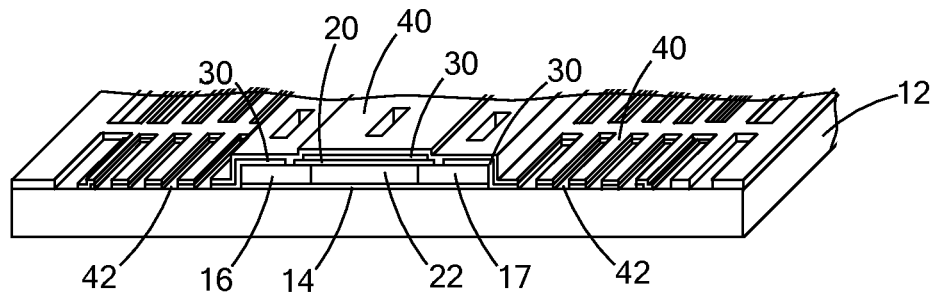
Figure 1F:
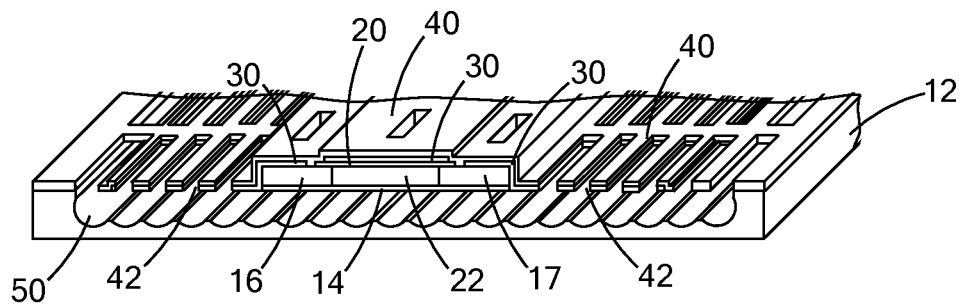

A fifth step is illustrated in FIG. 1e. In this fifth step, a plurality of etching windows 42 are opened in the first polymer layer 40 using an oxygen plasma. These etching windows 42 were formed through the metal traces, contact pads, and silicon islands 22 that lie below the first polymer layer 40 on the assembly. In one embodiment, the dimensions of the etching windows 42 are about 8 microns wide by about 25 microns long, and the etching windows 42 are placed about 60 microns apart. In a sixth step and as illustrated in FIG. 1f, the silicon substrate layer 12 is completely undercut in an etching process using an etchant. In one embodiment, the etchant is an isotropic gas phase silicon etchant. In a particular embodiment, the etchant is xenon difluoride. The etchant acts through the etching windows 42 formed in the fifth step of the protocol as described. The action of the etchant degrades silicon substrate layer 12 and leaves gap 50 at completion. Silicon islands 22, including MOSFETs, were protected by the first polymer layer 40 on the outermost layer and buried oxide layer 14 which was in direct contact with the silicon substrate layer 12 before itching. After etching, both MOSFETs and metal traces and pads are supported by a freestanding perforated polymer membrane as shown in FIG. 1*i*.

Figure 1G:
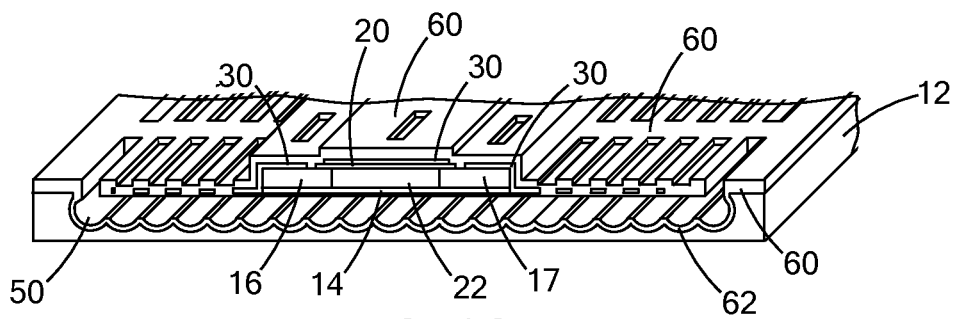
Figure 1H:
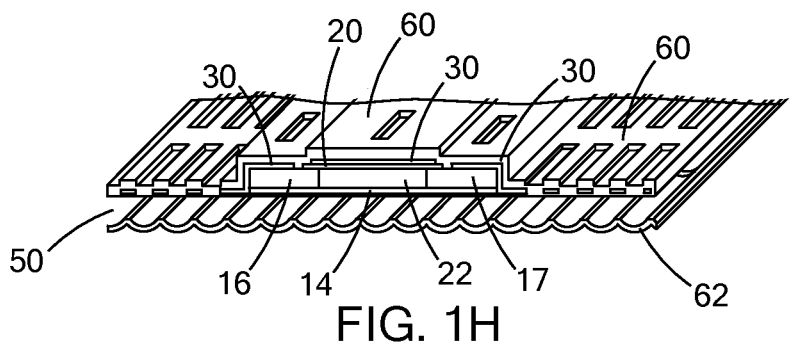
Figure 1H:
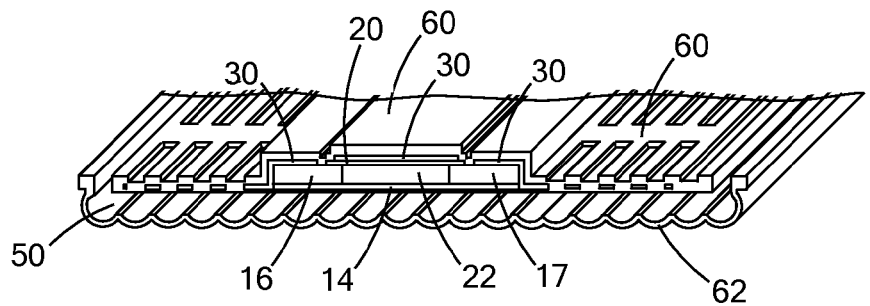
Figure 1I:
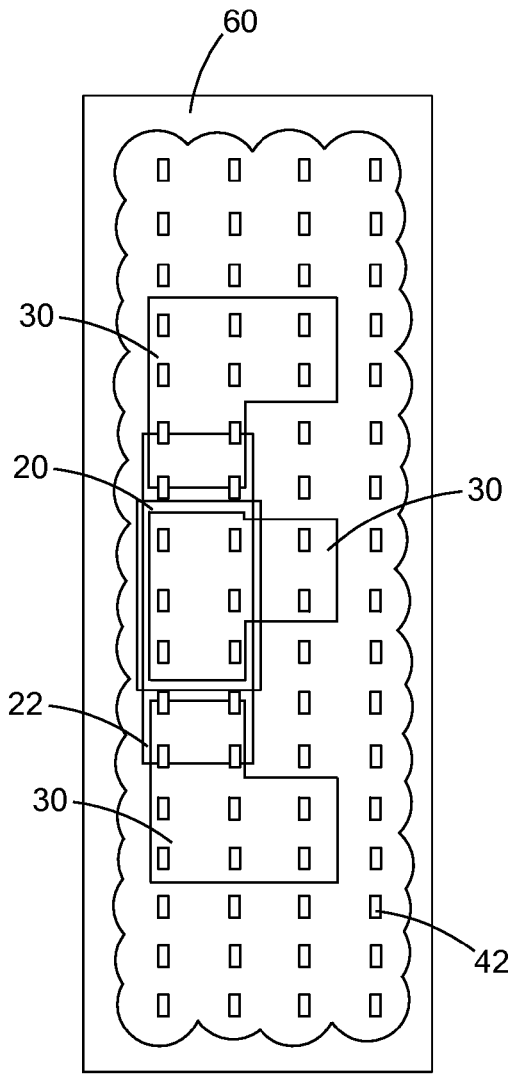

FIG. 1*g* illustrates a seventh step in this protocol. A second polymer layer 60 is conformally deposited or disposed to encapsulate the silicon island 22 and metal traces and pads. As before, in one embodiment the second polymer layer 60 can comprise parylene C. The second polymer layer 60 serves to encapsulate the device in a flexible polymer coating. The second deposition has the additional benefit of sealing the etching windows 42. Thereafter, oxygen plasma can be used to open bonding pads on the front side and cut the outline of the flexible device as shown in FIG. 1*h*. At this point the flexible device can be simply peeled off of the silicon substrate 12. The resulting device can be a polymer sheet with discrete islands embedded. A device manufactured like this can be stretchable by incorporating serpentine-shape connectors between silicon islands.

Following the steps detailed in FIG. 1*a*-1*h*, there are two physically separated polymer layers. Xenon difluoride isotropic gas phase silicon etchant can be used at the end of the procedure to release the device and to undercut the bulk silicon in the silicon substrate layer 12.

Treatment of the flexible device at this point, particularly with regard to the scalloped portion 62 of the second polymer layer 60, depends on the application in which the device is to be employed. The scalloped portion 62 will be kept or removed by modifying the final polymer etching mask. Because these first polymer layer 40 and the second polymer layer 60 form an enclosed space, in one embodiment (as illustrated in FIG. 1*h*') keeping the bottom scalloped polymer layer 62 can allow for straightforward integration of additional structural elements such as functional microchannels, tubes, balloons, microtubes, and diaphragms within the system. In other embodiments, such as that illustrated in FIG. 1*h* and including for the fabrication of some flexible MOSFETs, the bottom scalloped polymer layer 62 can be removed.

FIG. 1*i* illustrates a top view of a device fabricated in accordance with one embodiment of the invention.

Figure 2:
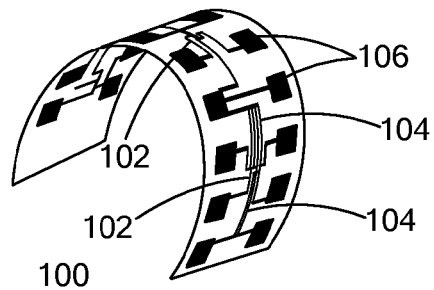
FIG. 2 depicts a plurality of devices integrated onto a flexible substrate in a bent configuration in accordance with one embodiment of the invention.

FIG. 2 shows a fabricated flexible device 100 in accordance with one embodiment of the invention. The flexibility can be clearly observed as the device can be bent completely back on itself. All the components 102 and metal traces 104, except contact pads 106, are encapsulated by conformally coated transparent polymer films. In the illustrated embodiment, the polymer films comprise parylene C. The device can be easily bent back to the flattened configuration and can also be distorted in different planar directions than that which is illustrated. This figure shows that a plurality of MOSFETs can be combined into a single flexible device. In some embodiments, the components that are incorporated into the flexible device can be of different sizes and can serve different functions. For instances, components such as strain gauges, flow sensors, temperature sensors, and pressure sensors, among others, can be incorporated into a flexible device fabricated in accordance with the principles of this invention.

Figure 3A:
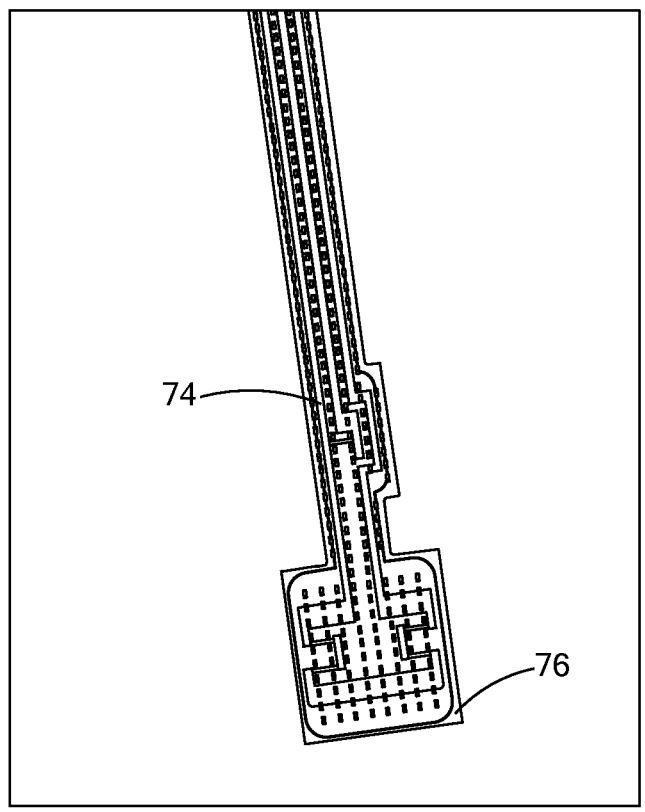
FIG. 3a-3b are top and backside views of a smart tube device in accordance with one embodiment of the invention.
Figure 3B:
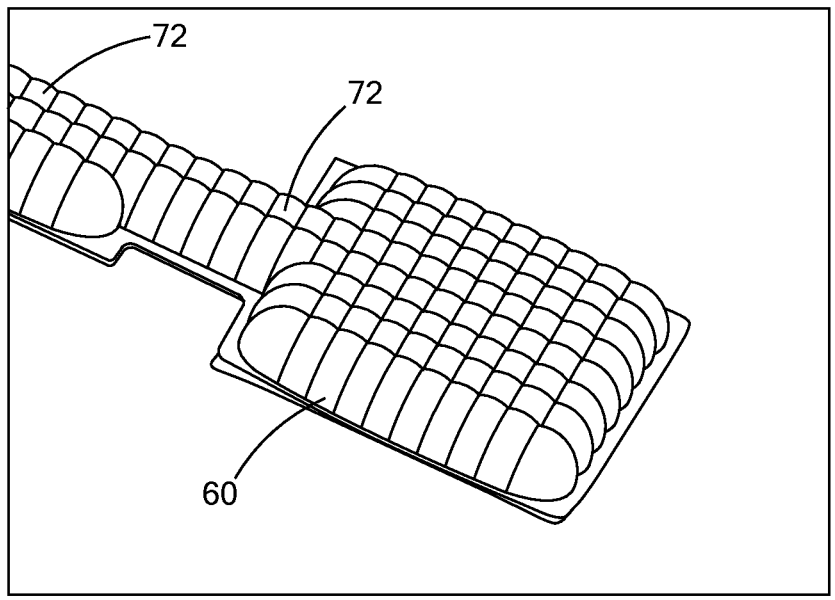

FIG. 3*a* is a top view of a smart tube device in accordance with one embodiment of the invention. The second polymer layer 60 (not shown) was retained and an integrated pressure sensor and a flow sensor 74 were included. The pressure sensor 76 is implemented using a silicon strain gauge. The bottom side of the pressure sensor diaphragm is connected to ambient or reference pressure via the microchannel 72 formed by retaining the second polymer layer 60. The flow sensor is also based on a silicon resistor, which functions as a heater and temperature sensor. FIG. 3*b* is an illustration of a scanning electron micrograph that shows the backside view of this smart tube device and provides a view of microchannel 72.

Figure 4A:
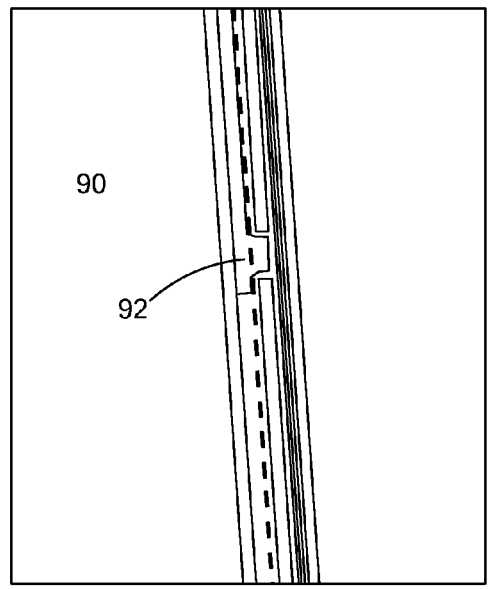
FIG. 4 is a top view of a flexible yarn showing an embedded metal-oxide-semiconductor field effect transistor (MOSFET) in accordance with one embodiment of the invention.
Figure 4B:
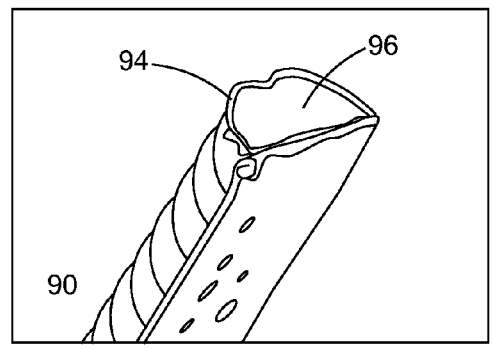

FIG. 4*a* illustrates another embodiment of the invention. A long smart yarn 90 having radius-to-length ratio of greater than 50, or a smart cannula device, can be fabricated in accordance with the principles of this invention. FIG. 4*a* is a top view of such a device. A MOSFET 92 is visible within the smart yarn. FIG. 4*b* shows a cross section of a smart yarn. The parylene channel 94 is filled with polydimethylsiloxane filling 96 to increase the mechanical strength of the yarn structure.

Figure 5:
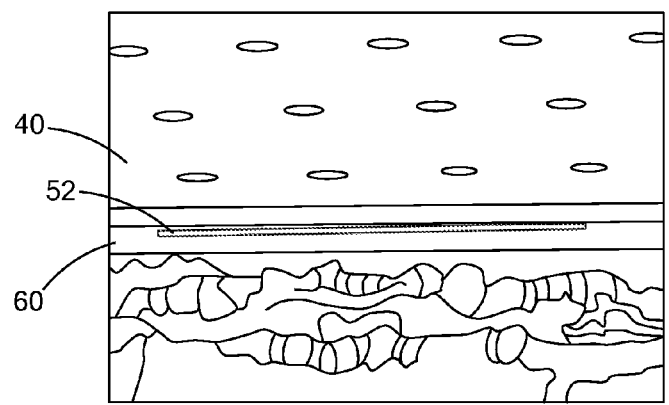
FIG. 5 is a representation of a scanning electron micrograph of a flexible semiconductor device in accordance with one embodiment of the invention.

In another embodiment of the invention, FIG. 5 is an illustration of a scanning electron micrograph of a cross section of a flexible device in accordance with the principles of the invention. In this device, the top polymer layer 40 and the bottom polymer layer 60 comprise parylene C. The relative position and thickness of the device layer 52 compared to the first polymer layer 40 and second polymer layer 60 can be observed in this image. The relative position of the device layer 52 can be adjusted by thinning either the upper or lower surfaces of the parylene C film using an oxygen plasma.

Figure 6:
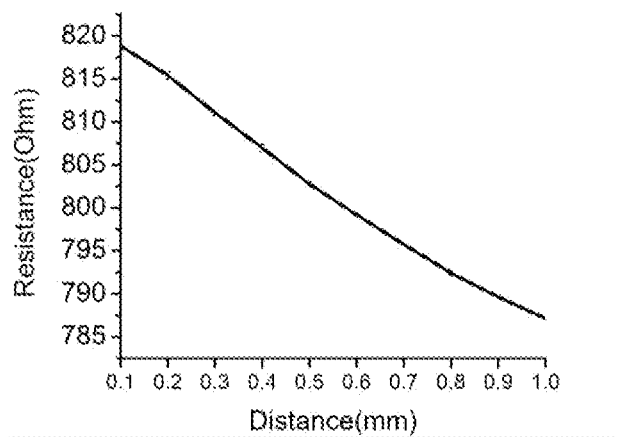
FIG. 6 is a plot of resistance change versus the distance a device is bent in accordance with one embodiment of the invention.

FIGS. 6 and 7 are plots showing the efficacy of flexible, foldable, and stretchable devices manufactured in accordance with the principles of the invention. In FIG. 6, testing of a flexible strain gauge is illustrated. In order to test the performance of the flexible strain gauge on a flexible skin, conductive epoxy was used to connect the testing wires to exposed Au contact pads in the device.

A simple experiment was carried out by pushing the flexible device in the longitudinal direction to induce buckling of the device. The displacement was controlled using a precision micro-manipulator. The resistance change as a function of displacement was recorded. The experiments were repeated 10 times and the averaged result with standard deviation is plotted in FIG. 6. In this embodiment, if the gauge factor is about 10 (for heavily doped n-type silicon), the strain experienced by the strain gauge is about 0.387% for about 1 mm displacement in the experiment (corresponding to a bending radius of about 3 mm).

The device of FIG. 6 is a particularly sensitive flexible strain gauge because the silicon device layer is not at the neutral plane. It will become even more sensitive if the polymer layers are selectively thinned. This would have the effect of moving the device layer further away from the neutral plane. It is envisioned that in other applications, the device layer can be positioned on the neutral plane to minimize strains by reducing the thickness of the top polymer layer using an oxygen plasma as described above.

Figure 7A:
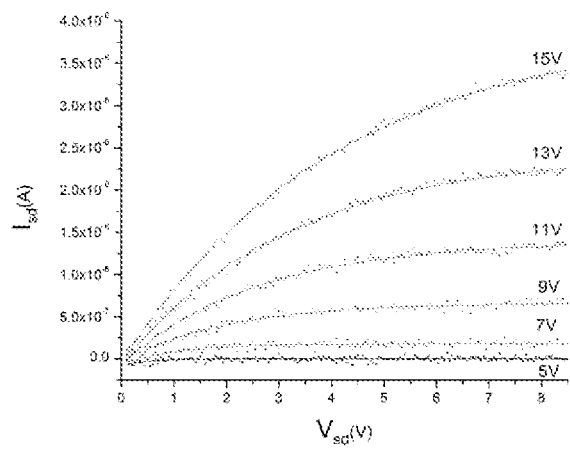
FIG. 7a-7b are plots of current versus voltage across the source and drain terminals of a MOSFET in a flexible device in accordance with one embodiment of the invention.
Figure 7B:
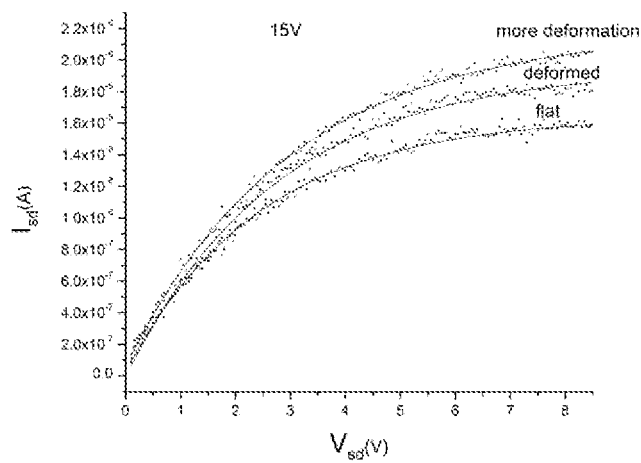

FIG. 7*a*-7*b* are current versus voltage plots across the source and drain terminals of a MOSFET in a flexible device built in accordance with the principles of the device. In FIG. 7*a*, change in current versus source/drain voltage at certain source/gate voltages are shown. The patterns comparing current to voltage are as would be expected in a functioning MOSFET.

In FIG. 7*b*, the voltage across the source and gate terminals is being held constant at 15 volts. A current versus voltage plot across the source and drain terminals was generated under three conditions: with the flexible device in its flattened state, when the device underwent a slight deformation, and when the device underwent a more severe deformation. The plot shows that as the amount of deformation of a flexible device is increased, the current between source and drain increases. Such an increase is due to an increase in charge carrier mobility when the MOSFET channel is strained.

FIG. 8 is a schematic that illustrates another embodiment of this invention. An invention built on the flexible electronics technology of the current disclosure avoids a known issue with previous flexible electronics technology, namely that the edge of the silicon island, where the flexible polymer cables interface the rigid silicon, is a stress concentration area and may cause the fracture of metal traces, leading to inoperability of the device.

The scheme illustrated in FIG. 8 provides a means of making robust, flexible connectors by integrating micro-cushions or channels underneath metal traces. Compared with the method of FIG. 1, the primary difference is that an additional backside deep reactive ion etching (DRIE) step is used to release a flexible cable. The cable or connector generated by this process has a microchannel 262 made of flexible polymer between a metal trace and a rigid silicon edge, which functions as a cushion, minimizing the stress concentration at the silicon/metal joint. The structure is much more robust than an ordinary flat polymer cable thanks to the micro-cushion/channel structure.

The process of FIG. 8 is largely similar to that described in FIG. 1. In a first step, illustrated in FIG. 8a, a thermal oxide 218 is grown and patterned onto a silicon substrate layer 212. In a second step, shown in FIG. 8b, metal traces 230 are deposited and patterned on the outermost layer of the thermal oxide layer 218 and the silicon substrate layer 212. In a third step, shown in FIG. 8c, a first polymer layer 240 is deposited or disposed and patterned by chemical vapor deposition over the metal traces 230 and the silicon substrate 212. Note that the plurality of etching windows 2242 has not had a deposition of the first polymer layer 240. In some embodiments, the metal traces 230 can comprise aluminum and the first polymer layer 240 can comprise parylene C In a fourth step, illustrated in FIG. 8d, an etchant is used through the plurality of etching windows 242 to degrade a portion of the silicon substrate layer 212. This action creates gap 250. In some embodiments, the etchant can be xenon difluoride.

Figure 8A:
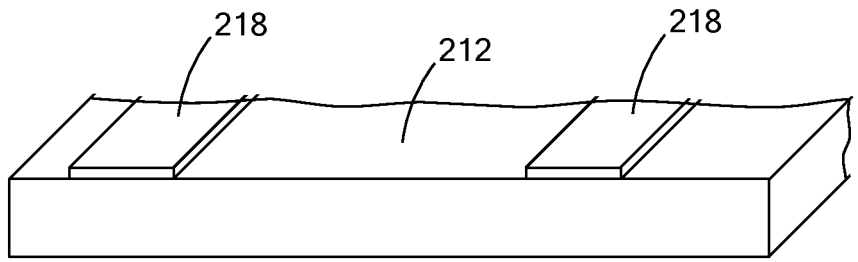
FIG. 8a-8f is a cross-sectional view of the steps of a method of fabrication of a flexible device in accordance with one embodiment of the invention.
Figure 8B:
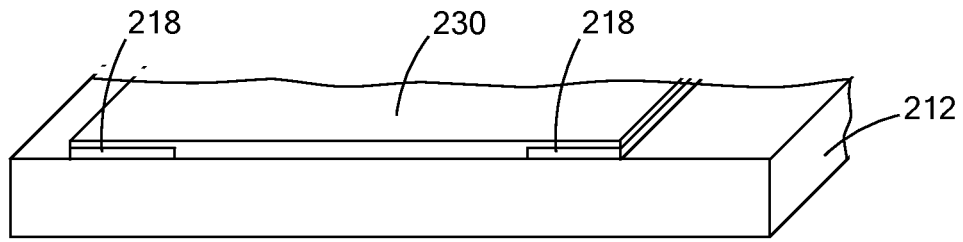
Figure 8C:
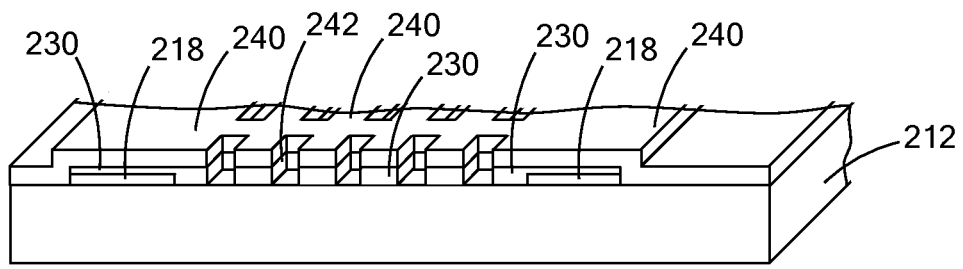
Figure 8D:
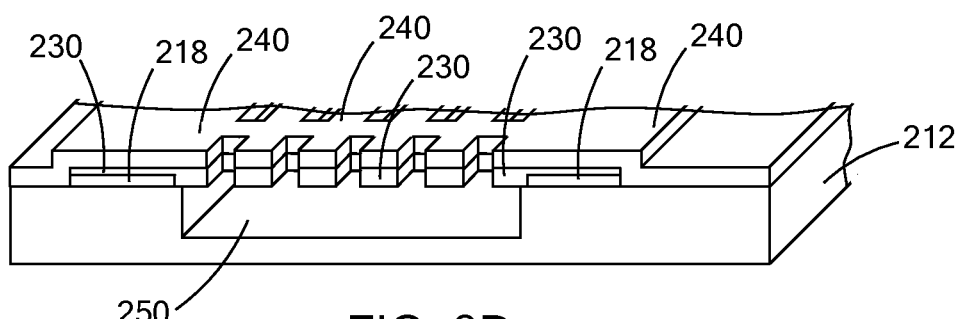
Figure 8E:
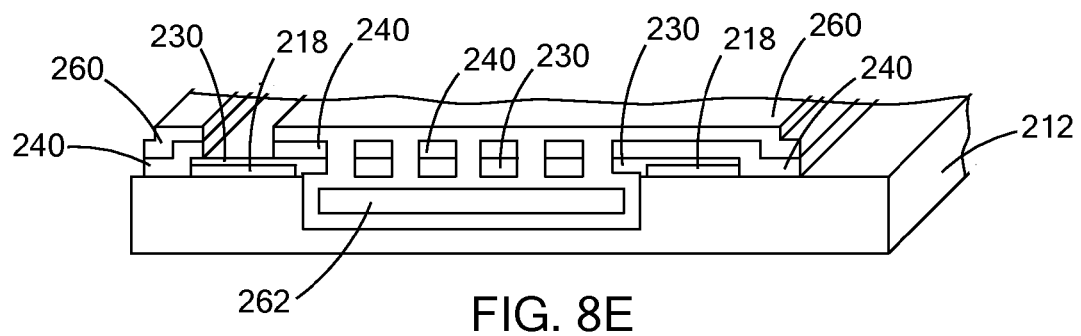

In a fifth step, illustrated in FIG. 8e, a second polymer layer 260 is deposited or disposed conformally on the entire assembly 210. This deposition results in the formation of a microchannel 262 completely surrounded by the second polymer layer 260 where gap 250 was. It also results in insulation of a plurality of cables 265 with a multilayered cushion of polymer.

Figure 8F:
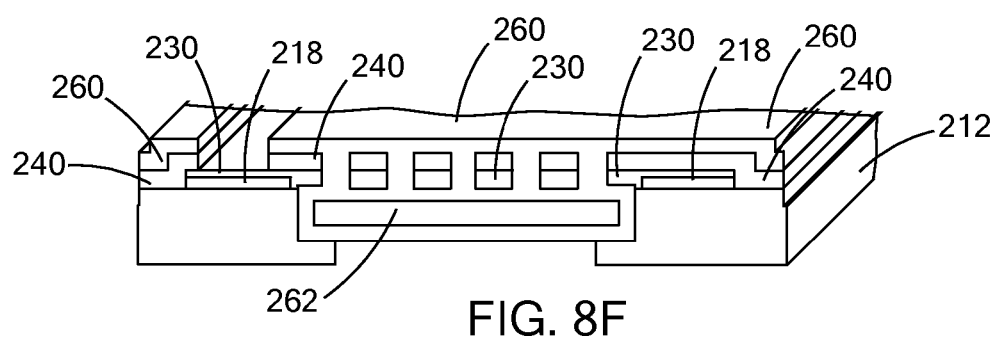

In a sixth step, as shown in FIG. 8f, a backside DRIE process is used to form silicon islands and to release individual cables. In some embodiments, cables can be rendered stretchable by being formed in a serpentine shape.

Figure 9:
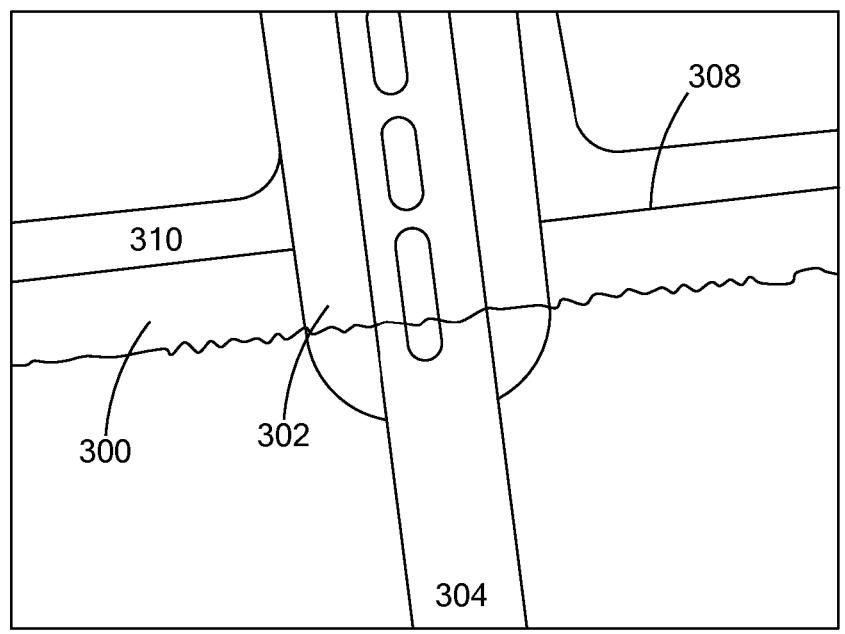
FIG. 9 is a top view of a stretchable device in accordance with one embodiment of the invention.

FIG. 9 is a topside view of a robust connector at the edge of a silicon island as manufactured in accordance with the procedure of FIG. 8. The micro-cushion structure 302 underneath the metal trace 304 extends into the silicon island 300, helping to minimize the stress experienced by the metal trace 304 at the joint 308 with the rigid silicon island 300 The new technology in accordance with the principles of this invention has advantages of being simple to implement and compatible with established commercial SOI CMOS process. High-density and high-performance CMOS circuits can be first fabricated using SOI foundry with only slight modification of the layout rules and readily transferred to a flexible substrate. The post-CMOS process only requires two masks, one used to form etching holes and the other to open the metal pads and shape the outline. In addition to simplicity and SOI-CMOS compatibility, the lamination of the electronics between parylene films offers protection against moisture from the environment. Since there is no transfer printing involved, flexible electronic devices with a significant increase device density and improved yield can be made. Moreover, the electronics or sensors can be positioned at either a neutral plane or any other selected plane by simply modifying the thickness of the first or the second polymer layer by oxygen plasma, thereby further increasing design flexibility.

One non-limiting advantage of the invention of the current disclosure is that integration of various MEMS sensors and microfluidic components on the flexible substrate is simple. Smart tubes, cannulas and yarns have been demonstrated. Robust flexible connector technology based on a cushion structure in accordance with another aspect of the invention reduces stress at the metal/silicon interface in devices. Flexible electronics or sensors made by the processes described in the present disclosure can be used in many applications, such as for instance wearable health monitoring and medical implants.

While the present invention has been described in terms of certain preferred embodiments, it will be understood that the invention is not limited to the disclosed embodiments, as those having skill in the art may make various modifications without departing from the scope of the following claims.

The invention claimed is:

1. A method of making a flexible device comprising:
providing a silicon-on-insulator wafer comprising a device layer having at least one silicon island and at least one metal trace, the device layer being posited on a buried oxide layer, the buried oxide layer being posited on a silicon substrate layer;
depositing a first polymer layer over the silicon-on-insulator wafer, the first polymer layer being above and in contact with the at least one silicon island and the at least one metal trace;
forming at least one etching windows through the first polymer layer, the device layer, and the buried oxide layer;
using an etchant through the at least one etching window to degrade the silicon substrate layer;
depositing a second polymer layer to seal the at least one etching window and conformally over the silicon substrate layer and the silicon-on-insulator wafer; and
removing the silicon substrate layer.

2. The method of claim 1 wherein depositing the second polymer layer forms at least one enclosed structure, each enclosed structure being formed within the second polymer layer and at least one of the first polymer layer, the device layer, and the buried oxide layer.

3. The method of claim 2 wherein the enclosed structure comprises at least one of a channel, a tube, a balloon, or a diaphragm.

4. The method of claim 1 wherein the first and second polymers layers comprise parylene C.

5. The method of claim 1 wherein the at least one etching window is formed using oxygen plasma.

6. The method of claim 1 wherein the etchant is xenon difluoride.

7. A flexible device made by a method comprising:
providing a silicon-on-insulator wafer comprising a device layer having at least one silicon island and at least one metal trace, the device layer being posited on a buried oxide layer, the buried oxide layer being posited on a silicon substrate layer;

depositing a first polymer layer over the silicon-on-insulator wafer, the first polymer layer being above and in contact with the at least one silicon island and the at least one metal trace;

forming at least one etching windows through the first polymer layer, the device layer, and the buried oxide layer;

using an etchant through the at least one etching windows to degrade the silicon substrate layer;

depositing a second polymer layer conformally over the silicon substrate layer and the silicon-on-insulator wafer; and removing the silicon substrate layer.

8. The flexible device of claim 7 comprising a metal oxide semiconductor field effect transistor.

9. The flexible device of claim 7 comprising a strain gauge.

10. The flexible device of claim 7 comprising a pressure sensor.

11. The flexible device of claim 7 comprising a flow sensor.

12. The flexible device of claim 7 comprising a microchannel.

13. The flexible device of claim 7 comprising a smart yarn.

14. The flexible device of claim 7 comprising a smart tube.

15. A method of making a flexible device comprising:
providing a wafer comprising a silicon substrate layer;
depositing a metal layer onto the silicon substrate layer;
patterning the metal layer to define a patterned substrate layer;
forming a first polymer layer by chemical vapor deposition on the patterned substrate layer;
etching the silicon substrate layer to form a channel mold to define a first etching step using an etchant;
depositing a second polymer layer to form a device channel from the channel mold;
etching the silicon substrate layer to form at least one silicon island to define a second etching step.

16. The method of claim 15 wherein the etching process of the second etching step is a backside deep reactive ion etch.

17. The method of claim 16 wherein the method is used to make a stretchable cable.

18. The method of claim 16 wherein the first polymer layer comprises parylene C.

19. The method of claim 16 wherein the second polymer layer comprises parylene C.

20. The method of claim 16 wherein etching the silicon substrate layer comprises using xenon difluoride.

* * * * *